(12) United States Patent
Takahashi

(10) Patent No.: US 8,203,254 B2
(45) Date of Patent: Jun. 19, 2012

(54) POLYMER ACTUATOR DEVICE

(75) Inventor: Isao Takahashi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/274,261

(22) Filed: Oct. 14, 2011

(65) Prior Publication Data

US 2012/0032564 A1  Feb. 9, 2012

Related U.S. Application Data

(63) Continuation of application No. PCT/JP2010/058872, filed on May 26, 2010.

(30) Foreign Application Priority Data

May 26, 2009  (JP) ................................. 2009-125968

(51) Int. Cl.
H01L 41/08 (2006.01)

(52) U.S. Cl. .................. 310/328; 310/331; 310/800

(58) Field of Classification Search .......... 310/328, 310/330–331, 800
See application file for complete search history.

(56) References Cited

U.S. PATENT DOCUMENTS

| | | | | |
|---|---|---|---|---|
| 5,977,685 A * | 11/1999 | Kurita et al. | | 310/311 |
| 7,259,495 B2 * | 8/2007 | Asai et al. | | 310/311 |
| 7,696,669 B2 * | 4/2010 | Kudoh | | 310/311 |
| 7,733,000 B2 * | 6/2010 | Kudoh | | 310/332 |
| 7,872,396 B2 * | 1/2011 | Chiang et al. | | 310/311 |
| 7,982,368 B2 * | 7/2011 | Takahashi | | 310/330 |
| 2005/0168113 A1 * | 8/2005 | Hirai et al. | | 310/800 |
| 2007/0114116 A1 * | 5/2007 | Nagai et al. | | 200/181 |
| 2009/0014320 A1 * | 1/2009 | Chiang et al. | | 204/252 |

FOREIGN PATENT DOCUMENTS

| | | |
|---|---|---|
| JP | 2003-152234 | 5/2003 |
| JP | 2008-148452 | 6/2008 |
| JP | 2008-211916 | 9/2008 |
| JP | 2009-278787 | 11/2009 |
| JP | 2010093954 A * | 4/2010 |
| JP | 2011193679 A * | 9/2011 |
| JP | 2011205751 A * | 10/2011 |

OTHER PUBLICATIONS

Search Report dated Aug. 31, 2010 from Japanese Application No. PCT/JP2010/058872.

* cited by examiner

Primary Examiner — J. San Martin
(74) Attorney, Agent, or Firm — Beyer Law Group LLP

(57) ABSTRACT

A polymer actuator device includes an electrolyte layer, a pair of electrode layers that are provided on both surfaces of the electrolyte layer in a thickness direction of the electrolyte layer, a polymer actuator that is bent when a voltage is applied between the pair of electrode layers, and terminal parts that apply a voltage to the polymer actuator. The polymer actuator includes a deformable portion and a supported portion. A conductive porous member is interposed between a first electrode layer, which is positioned on the side of the supported portion of the polymer actuator corresponding to a negative electrode, and the terminal part.

10 Claims, 2 Drawing Sheets

POLYMER ACTUATOR DEVICE

CLAIM OF PRIORITY

This application is a Continuation of International Application No. PCT/JP2010/058872 filed on May 26, 2010, which claims benefit of Japanese Patent Application No. 2009-125968 filed on May 26, 2009. The entire contents of each application noted above are hereby incorporated by reference.

BACKGROUND OF THE INVENTION

1. Field of the Invention

The present invention relates to a polymer actuator that includes an electrolyte layer and a pair of electrode layers provided on both surfaces of the electrolyte layer and is bent when a voltage is applied between the pair of electrode layers.

2. Description of the Related Art

Inventions relating to a polymer actuator are disclosed in Japanese Unexamined Patent Application Publication No. 2008-148452 and Japanese Unexamined Patent Application Publication No. 2008-211916. A polymer actuator includes an electrolyte layer and a pair of electrode layers provided on both surfaces of the electrolyte layer.

Further, when a voltage is applied between the pair of electrode layers, the polymer actuator can be bent.

However, it was found that an ionic liquid is exuded from the surface of the electrode layer with the movement of ions between the electrolyte layer and the electrode layers when the DC drive of the polymer actuator is performed or the polymer actuator is driven with the waveform of a voltage having a very long cycle.

When the ionic liquid is exuded from the surface of the electrode layer as described above, conductivity between the electrode layer and a terminal part for applying a voltage to the polymer actuator deteriorates. For this reason, there has been a problem in that the operation of the polymer actuator deteriorates or, in the worst case, the polymer actuator does not operate.

Further, adverse effects, such as corrosion, oxidation, and dielectric breakdown around the polymer actuator, have occurred due to the exudation of the ionic liquid from the surface of the electrode layer.

Furthermore, it was found that the exudation of the ionic liquid particularly occurs on the surface of only one electrode layer and mostly does not occur on the surface of the other electrode layer when the polymer actuator is bent in one direction.

SUMMARY OF THE INVENTION

The invention provides a polymer actuator device that successfully keeps conductivity between a terminal part and an electrode layer of a polymer actuator even when an ionic liquid is exuded from the surface of an electrode layer.

According to an aspect of the invention, there is provided a polymer actuator device. The polymer actuator device includes an electrolyte layer, a pair of electrode layers that are provided on both surfaces of the electrolyte layer in a thickness direction of the electrolyte layer, a polymer actuator that is bent when a voltage is applied between the pair of electrode layers, and terminal parts that apply a voltage to the polymer actuator. The polymer actuator includes a deformable portion and a supported portion. A conductive porous member is interposed between at least one electrode layer of the supported portion of the polymer actuator and the terminal part.

Accordingly, it may be possible to absorb an ionic liquid, which is exuded from the surface of the electrode layer, by the conductive porous member and to successfully keep conductivity between the terminal part and the electrode layer of the polymer actuator. Further, it may be possible to suppress adverse effects such as corrosion at the terminal part or around the terminal part.

In the aspect of the invention, the conductive porous member may be interposed between the electrode layer and the terminal part corresponding to a negative electrode.

Further, in the aspect of the invention, the conductive porous member may be interposed between the terminal part and the electrode layer that faces the outside when a voltage is applied between the pair of electrode layers and the polymer actuator is bent.

The exudation of the ionic liquid is apt to occur on the negative electrode to which positive ions move by the application of a voltage or on the outer electrode layer that significantly swells when the polymer actuator is bent. For this reason, it may be possible to more effectively and successfully keep conductivity between the terminal part and the electrode layer of the polymer actuator by providing a conductive porous member on the electrode layer that corresponds to a negative electrode or on the electrode layer that faces the outside when the polymer actuator is bent.

Further, in the aspect of the invention, the conductive porous members may be interposed between the both the electrode layers and the terminal parts, respectively. Accordingly, it may be possible to appropriately absorb the ionic liquid, which is exuded from the surfaces of the respective electrode layers, by the conductive porous members and to successfully keep conductivity between the terminal part and the electrode layer of the polymer actuator. The aspect where the conductive porous members are provided on both sides of the polymer actuator as described above is effective, for example, when the DC drive of the polymer actuator is performed in both directions, the AC drive of the polymer actuator is performed with low frequency, or when it is unclear from which electrode layer an ionic liquid is exuded.

Furthermore, in the aspect of the invention, the conductive porous member may be provided on the surface of the electrode layer over the deformable portion from the supported portion. Accordingly, it may be possible to absorb an ionic liquid, which is exuded from the surface of the electrode layer of the deformable portion, by the conductive porous member and to more effectively suppress adverse effects such as corrosion around the polymer actuator. Moreover, when the state of the polymer actuator returns to a non-operating state from the operating state of the polymer actuator, the ionic liquid absorbed in the conductive porous member can return to the inside of the polymer actuator to some extent again, for example, if a reverse potential is applied between the electrode layers. Accordingly, even though the polymer actuator is repeatedly used, it may be possible to suppress the deterioration of the property of the polymer actuator.

Further, in the aspect of the invention, the conductive porous member provided at the deformable portion may be apt to be deformed by an external force as compared to the conductive porous member provided at the supported portion. For example, it is preferable that the thickness of the conductive porous member provided at the deformable portion be smaller than that of the conductive porous member provided at the supported portion. Alternatively, it is preferable that the porosity of the conductive porous member provided at the deformable portion be higher than that of the conductive porous member provided at the supported portion.

According to the polymer actuator of the aspect of the invention, it may be possible to successfully keep conductivity between the terminal part and the electrode layer of the polymer actuator. Further, it may be possible to suppress adverse effects such as corrosion at the terminal part or around the terminal part.

DESCRIPTION OF THE PREFERRED EMBODIMENTS

Figure 1:
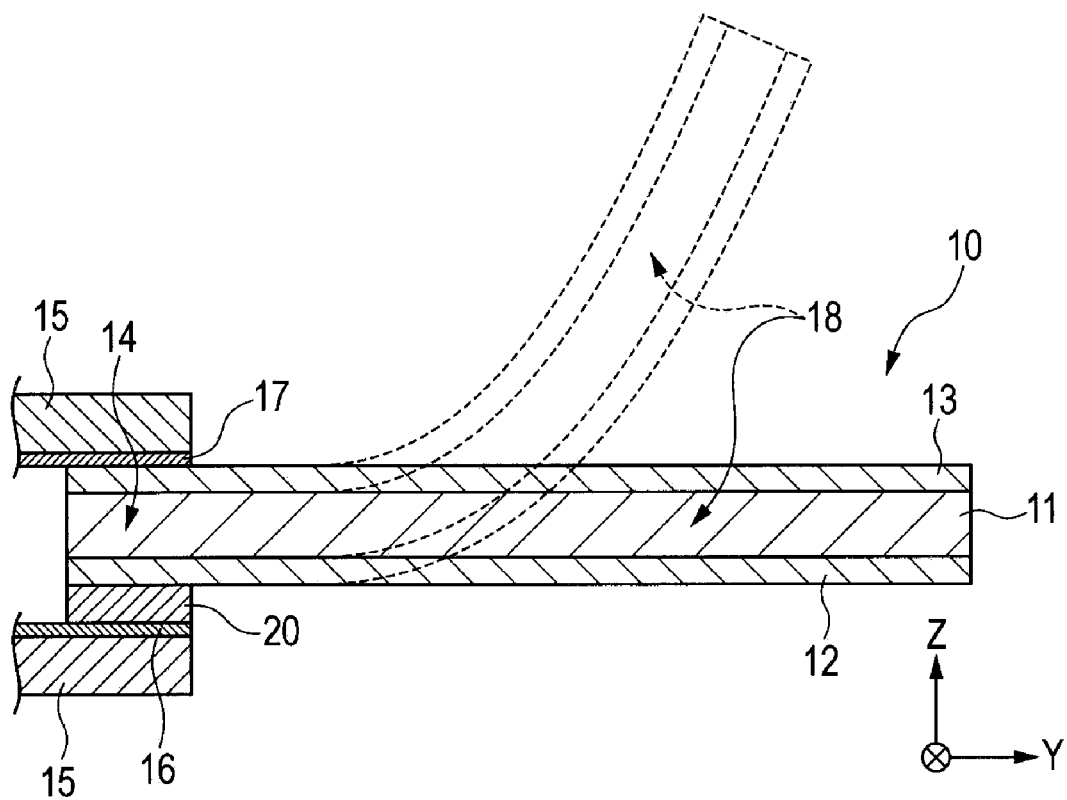
FIG. 1 is a longitudinal sectional view of a polymer actuator device according to a first embodiment taken in the thickness direction.
Figure 2:
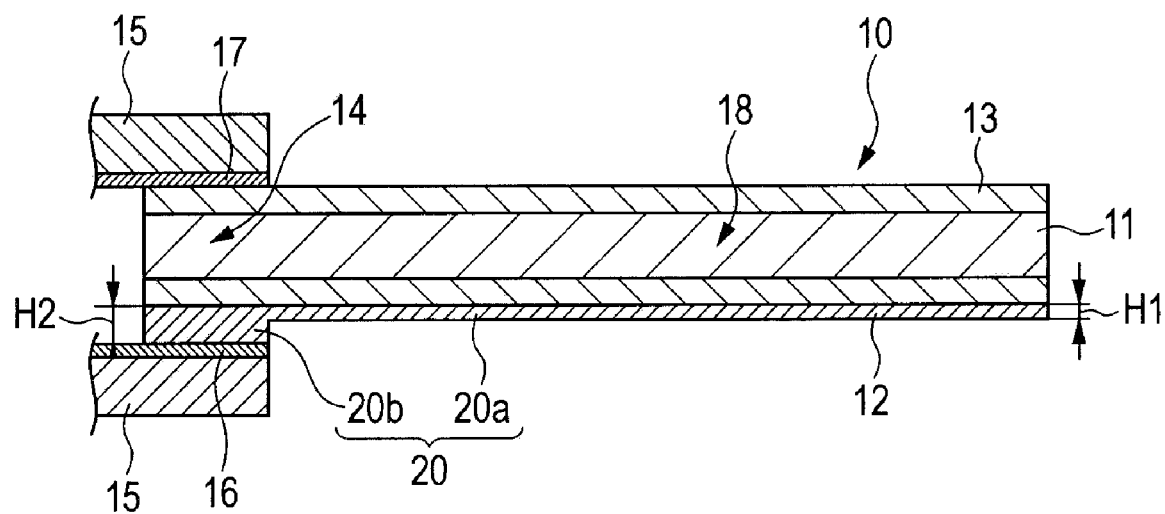
FIG. 2 is a longitudinal sectional view of a polymer actuator device according to a second embodiment taken in the thickness direction.
Figure 3:
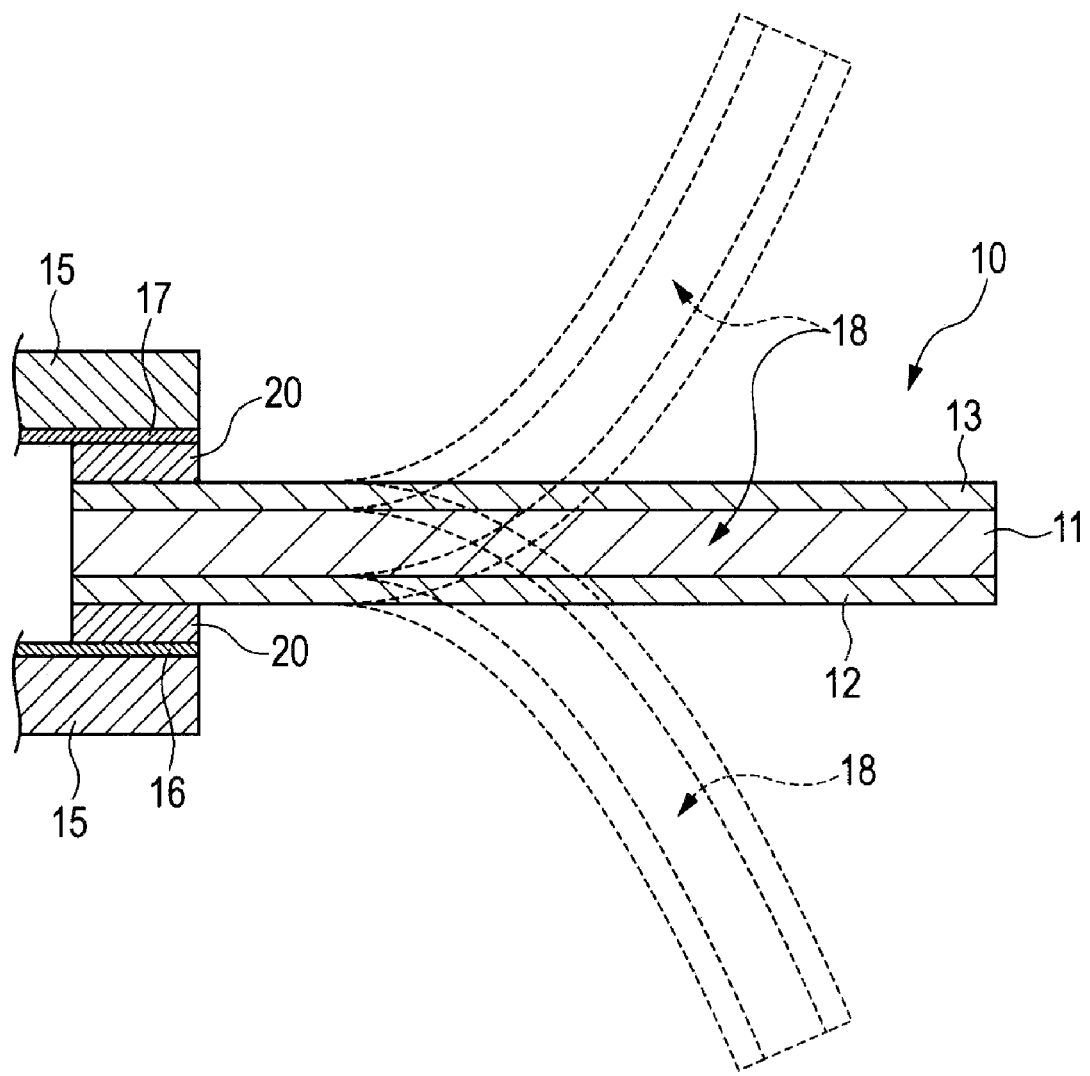
FIG. 3 is a longitudinal sectional view of a polymer actuator device according to a third embodiment taken in the thickness direction.

FIG. 1 is a longitudinal sectional view of a polymer actuator device according to a first embodiment taken in the thickness direction, FIG. 2 is a longitudinal sectional view of a polymer actuator device according to a second embodiment taken in the thickness direction, and FIG. 3 is a longitudinal sectional view of a polymer actuator device according to a third embodiment taken in the thickness direction.

A polymer actuator 10 according to this embodiment includes an electrolyte layer 11, and electrode layers 12 and 13 that are formed on both surfaces of the electrolyte layer 11 in the thickness direction of the electrolyte layer 11 (Z direction).

In this embodiment, there is suggested the polymer actuator 10 including the electrolyte layer 11 that includes an ionic liquid and a base polymer and the electrode layers 12 and 13 that include a conductive filler such as carbon nanotubes, an ionic liquid, and a base polymer. Polyvinylidene fluoride (PVDF), polymethyl methacrylate (PMMA), or the like may be suggested as the base polymer.

The polymer actuator 10 having a cross-sectional structure, which includes the electrolyte layer 11 and the electrode layers 12 and 13 formed on both surfaces of the electrolyte layer 11 as shown in FIG. 1, has a rectangular shape of which the size in the length direction (Y direction) is longer than the size in the width direction (X direction) and the size thickness direction (Z direction).

As shown in FIG. 1, for example, one end portion of the polymer actuator 10 in the Y direction is a supported portion 14 and fixedly supported by fixing portions 15. Further, terminal parts 16 and 17, which are provided on the surfaces of the fixing portions 15, are electrically connected to the electrode layers 12 and 13 of the supported portion 14 of the polymer actuator 10. Meanwhile, in FIG. 1, the polymer actuator 10 is fixedly supported by the fixing portions 15 and the terminal parts 16 and 17 are formed by forming coating films on the surfaces of the fixing portion 15 or plating the surfaces of the fixing portion 15. However, for example, the terminal parts 16 and 17 may be formed of metal plates, and the polymer actuator 10 may be fixedly supported by the terminal parts 16 and 17. The same as described above may be applied to even other embodiments.

When a voltage is applied between the electrode layers 12 and 13 of the polymer actuator 10, a difference between the swelling of the first electrode layer 12 and the swelling of the second electrode layer 13 occurs, so that bending stress is generated. Accordingly, a deformable portion 18, which protrudes from the fixing portions 15 in the Y direction so as to be long, is bent, for example, upward.

In the embodiment shown in FIG. 1, the terminal part 16 corresponds to a negative electrode and the terminal part 17 corresponds to a positive electrode. For this reason, positive ions in the electrolyte layer 11 move toward the first electrode layer 12 due to the application of a voltage. In this case, if it is supposed that the positive ions are larger than negative ions, the volume of the electrolyte layer is increased at a position close to the first electrode layer 12. That is, since expansion stress is generated at a portion close to the first electrode layer 12 and expansive strain is generated on the basis of the expansion stress, bending stress is generated at the polymer actuator 10 and the polymer actuator 10 is bent upward as shown in FIG. 1.

When being bent, the first electrode layer 12 corresponding to a negative electrode becomes outside as shown in FIG. 1. If the bent state of the polymer actuator 10 is kept for a long time, the ionic liquid is extruded to the outside and exuded from the surface of the first electrode layer 12.

In this embodiment, a conductive porous member 20 is interposed between the terminal part 16 and the first electrode layer 12 of the supported portion 14 of the polymer actuator 10 as shown in FIG. 1. Accordingly, even if the ionic liquid is exuded from the surface of the first electrode layer 12, the ionic liquid can be absorbed in the conductive porous member 20. Therefore, it may be possible to successfully keep conductivity between the first electrode layer 12 and the terminal part 16. Further, since it is possible to suppress exudation of the ionic liquid to the terminal part 16, it may be possible to suppress adverse effects, such as corrosion, oxidation, and dielectric breakdown around at the terminal part 16 or around the terminal part 16.

The conductive porous member 20 may be formed in the shape of a sheet, or may be directly formed on the surface of the terminal part 16 or the surface of the first electrode layer 12 by application or the like. Further, the conductive porous member 20 may have or may not have adhesiveness. If the conductive porous member 20 does not have adhesiveness, a conductive adhesive may be applied between the conductive porous member 20 and the terminal part 16 or between the conductive porous member 20 and the first electrode layer 12 and some pressure may be applied and kept between the first electrode layer 12 and the terminal part 16 while the conductive porous member 20 is interposed. Furthermore, when a sheet-like member is used as the conductive porous member 20, the holes of the sheet-like member are widened without significant decrease in conductivity if the sheet-like member is attached while being stretched in each direction by about 10%. Therefore, it may be possible to effectively use porosity.

As the conductive porous member 20, there may be exemplified an acrylic conductive adhesive sheet (for example, model number T4420W manufactured by Sony Chemical & Information Device Corporation); conductive silicone rubber (for example, EC series manufactured by Shin-Etsu Chemical Co., Ltd.); a conductive epoxy resin, a material that is obtained by adding a silicon foaming agent to conductive silicone (for example, KE16-508 manufactured by GE Toshiba Silicones Co., Ltd.); a material that is obtained by applying Ketjen black (for example, manufactured by Ketjen Black International Company) to a porous resin (polytetrafluoroethylene (PTFE), polyvinylidene fluoride (PVDF), or porous cellulose together with a solvent and a binder resin; a porous conductive polymer, or the like.

In an embodiment shown in FIG. 2, a conductive porous member 20a is formed so as to extend over the surface of a first electrode layer 12 of a deformable portion 18. Accordingly, it may be possible to absorb an ionic liquid, which is exuded from the surface of the first electrode layer 12 of the deformable portion 18, by the conductive porous member 20a and to effectively suppress adverse effects such as corrosion around a polymer actuator 10. Further, when the state of the polymer actuator 10 returns to a non-operating state from the operating state of the polymer actuator 10 (see a bent state shown in FIG. 1 by a dashed line), the ionic liquid absorbed in the conductive porous member 20 can return to the inside of the electrolyte layer 11 to some extent again, for example, if a reverse potential is applied between the electrode layers 12 and 13. Accordingly, even though the polymer actuator 10 is repeatedly used, it may be possible to suppress the deterioration of the property of the polymer actuator 10.

Furthermore, it is preferable that the thickness H1 of the conductive porous member 20a formed at the deformable portion 18 be smaller than the thickness H2 of a conductive porous member 20b formed at the supported portion 14 as shown in FIG. 2. Accordingly, the conductive porous member 20a does not easily hinder the operation of the deformable portion 18, so that it may be possible to appropriately bend the deformable portion 18. The thickness H1 of the conductive porous member 20a is in the range of about 5 to 20 μm, and the thickness H2 of the conductive porous member 20b is in the range of about 50 to 200 μm.

Moreover, it may be possible to reduce the stiffness of the conductive porous member 20a by making the porosity of the conductive porous member 20a, which is formed at the deformable portion 18, be higher than the porosity of the conductive porous member 20b formed at the supported portion 14. Accordingly, the conductive porous member 20a does not easily hinder the operation of the deformable portion 18, so that it may be possible to appropriately bend the deformable portion 18. In this case, the thickness of the conductive porous member 20a formed at the deformable portion 18 may be substantially equal to that of the conductive porous member 20b formed at the supported portion 14. The adjustment of porosity may be achieved by the adjustment of the number of holes or the diameters of the holes.

Next, in an embodiment shown in FIG. 3, a conductive porous member 20 is interposed not only between a first electrode layer 12 of a supported portion 14 of a polymer actuator 10 and a terminal part 16 but also between a second electrode layer 13 and a terminal part 17.

Accordingly, when an ionic liquid is exuded not only from the surface of the first electrode layer 12 but also from the surface of the second electrode layer 13 or when it is unclear from which surface of the first and second electrode layers 12 and 13 an ionic liquid is exuded, it may be possible to successfully keep conductivity between the second electrode layer 13 and the terminal part 17 and between the first electrode layer 12 and the terminal part 16, respectively.

As described above, an ionic liquid may be exuded from the first electrode layer 12 that corresponds to a negative electrode and becomes outside when the deformable portion 18 is bent. In this case, an ionic liquid is not exuded from the second electrode layer 13 that corresponds to a positive electrode (or the amount of the exuded ionic liquid is very small). Accordingly, in the case of DC drive of the polymer actuator 10, it is enough that the conductive porous member 20 is interposed only between the terminal part 16 and the first electrode layer 12 corresponding to a negative electrode as shown in FIGS. 1 and 2. However, when the polarities of the electrode layers are switched by the AC drive of the polymer actuator 10 as shown in FIG. 3 and the deformable portion 18 of the polymer actuator 10 is alternately bent upward and downward in FIG. 3, an ionic liquid may be exuded from both the surface of the first electrode layer 12 and the surface of the second electrode layer 13. Accordingly, if the conductive porous member 20 is interposed not only between the first electrode layer 12 and the terminal part 16 but also between the second electrode layer 13 and the terminal part 17 as shown in FIG. 3, it may be possible to successfully keep conductivity between the second electrode layer 13 and the terminal part 17 and between the first electrode layer 12 and the terminal part 16 even though an ionic liquid is exuded from the surfaces of the respective electrode layers 12 and 13.

Further, in the case of the AC drive of the polymer actuator 10 as described above, an ionic liquid, which is exuded when the first electrode layer 12 is a negative electrode, is absorbed in the conductive porous member 20 positioned between the first electrode layer 12 and the terminal part 16. However, when the first electrode layer 12 is changed into a positive electrode, the absorbed ionic liquid returns to the inside of the polymer actuator 10 to some extent again. Furthermore, if the conductive porous member 20 is provided so as to extend over the deformable portion 18 as shown in FIG. 2, that is, if the conductive porous members 20 are provided at the upper and lower portion of the deformable portion 18 (on the surfaces of the first and second electrode layers 12 and 13) in FIG. 3, it may be possible to suppress the deterioration of the property of the polymer actuator 10 even through the AC drive of the polymer actuator 10 is repeated.

The structure of FIG. 3 is effective, for example, when the DC drive of the polymer actuator 10 is performed in both directions, the AC drive of the polymer actuator 10 is performed with low frequency, or when it is unclear from which electrode layer an ionic liquid is exuded.

Figure 4:
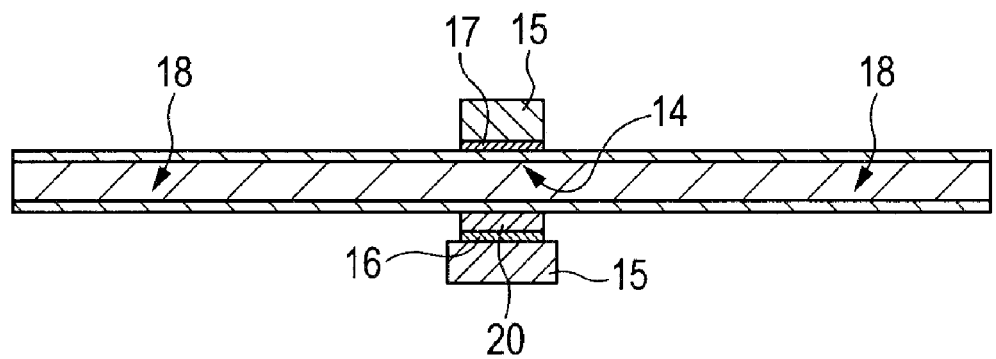
FIG. 4 is a longitudinal sectional view, which shows the position of a supported portion of a polymer actuator, of a polymer actuator device according to an embodiment substituted for the embodiments shown in FIGS. 1 to 3.

In all the embodiments shown in FIGS. 1 to 3, one end portion of the polymer actuator 10 has been fixedly supported as the supported portion 14. However, for example, fixing portions 15 including terminal parts 16 and 17 may be provided on the surfaces of the substantially middle portion of the polymer actuator 10 as shown in FIG. 4 and portions of the polymer actuator 10, which are positioned on both sides of the fixing portions 15, form deformable portions 18 and 18 (butterfly type).

Moreover, instead of the above-mentioned structure, the electrolyte layer 11 may be made of an ion-exchange resin or a material that contains a polarizable organic solvent containing salt or a liquid organic compound, which is an ionic liquid. For example, the ion-exchange resin is a positive ion-exchange resin. Accordingly, negative ions are fixed to the ion-exchange resin and positive ions can freely move. A resin that is obtained by adding a functional group, such as a sulfonic acid group or a carboxyl group, to a resin, such as a polyethylene resin, a polystyrene resin, or a fluororesin may be preferably used as the positive ion-exchange resin.

Further, the electrode layers 12 and 13 may have the structure that is obtained by mixing a conductive filler to the same resin structure as the resin structure of the electrolyte layer 11. Carbon nanotubes, carbon nanofibers, or the like may be suggested as the conductive filler. For example, it may be possible to form a polymer actuator 10, which is formed of a three-layer film, by superimposing an electrolyte sheet and an electrode layer sheet including a conductive filler.

Furthermore, in the above-mentioned structure, the first electrode layer 12, which is a negative electrode, is positioned outside when the deformable portion 18 is bent. However, the invention is not limited thereto.

It should be understood by those skilled in the art that various modifications, combinations, sub-combinations and alterations may occur depending on design requirements and other factors insofar as they are within the scope of the appended claims of the equivalents thereof.

What is claimed is:

1. A polymer actuator device comprising:
    a polymer actuator including:
        an electrolyte layer having a first surface and a second surface opposite to the first surface;
        a pair of electrode layers including a first electrode layer and a second electrode layer provided on the first surface and the second surface of the electrolyte layer, respectively, the polymer actuator having a deformable portion and supported portion, the deformable portion being configured to bend when a voltage is applied between the pair of electrode layers; and
    a terminal part configured to apply a voltage to the polymer actuator at the supported portion of the polymer actuator,
    wherein the polymer actuator device further comprises:
        a conductive porous member interposed between at least one of the first and second electrode layers in the supported portion and the terminal part.

2. The polymer actuator device according to claim 1, wherein the terminal part includes a positive electrode and a negative electrode, and the conductive porous member is interposed between the negative electrode and corresponding one of the first and second electrode layers.

3. The polymer actuator device according to claim 1, wherein the conductive porous member is interposed between the terminal part and one of the first and second electrode layers which is on an outer side with respect to a bending direction of the polymer actuator when the voltage is applied between the pair of electrode layers of the polymer actuator.

4. The polymer actuator device according to claim 1, wherein the conductive porous member is interposed between the first electrode layer and the terminal part, and between the second electrode layer and the terminal part.

5. The polymer actuator device according to claim 1, wherein the conductive porous member is also provided on a surface of the electrode layer, the conductive porous member extending from the supported portion to the deformable portion.

6. The polymer actuator device according to claim 5, wherein the conductive porous member provided in the deformable portion is more deformable under an external force as compared to the conductive porous member provided in the supported portion.

7. The polymer actuator device according to claim 6, wherein the thickness of the conductive porous member provided in the deformable portion is smaller than that of the conductive porous member provided in the supported portion.

8. The polymer actuator device according to claim 6, wherein the porosity of the conductive porous member provided in the deformable portion is higher than that of the conductive porous member provided in the supported portion.

9. The polymer actuator device according to claim 1, wherein the supported portion and the terminal part are provided at an end portion of the polymer actuator.

10. The polymer actuator device according to claim 1, wherein the supported portion and the terminal part are provided at an center portion of the polymer actuator.

* * * * *